(12) United States Patent
Peguero Lorenz et al.

(10) Patent No.: US 11,425,966 B2
(45) Date of Patent: Aug. 30, 2022

(54) METHOD FOR MANUFACTURING A DEVICE FOR ADAPTING A FOOTWEAR TO THE SPECIFIC DEFORMATIONS OF THE FOOT OF A USER AND DEVICE

(71) Applicant: PODO ACTIVA, S.L., Huesca (ES)

(72) Inventors: Angel Peguero Lorenz, Huesca (ES); Antonio Gómez Bernal, Huesca (ES); José Victor Alfaro Santafé, Huesca (ES); José Javier Alfaro Santafé, Huesca (ES); Carla Lanuza Cerzocimo, Huesca (ES)

(73) Assignee: PODO ACTIVA, S.L., Huesca (ES)

( * ) Notice: Subject to any disclaimer, the term of this patent is extended or adjusted under 35 U.S.C. 154(b) by 212 days.

(21) Appl. No.: 16/620,296

(22) PCT Filed: May 11, 2018

(86) PCT No.: PCT/EP2018/062217
§ 371 (c)(1),
(2) Date: Dec. 6, 2019

(87) PCT Pub. No.: WO2018/224239
PCT Pub. Date: Dec. 13, 2018

(65) Prior Publication Data
US 2020/0205526 A1   Jul. 2, 2020

(30) Foreign Application Priority Data

Jun. 7, 2017   (EP) ..................................... 17382342

(51) Int. Cl.
*A43D 1/02*      (2006.01)
*G06F 30/10*    (2020.01)
(Continued)

(52) U.S. Cl.
CPC .............. *A43D 1/025* (2013.01); *B33Y 50/00* (2014.12); *G06F 30/10* (2020.01); *A43D 3/08* (2013.01); *A43D 3/14* (2013.01); *A43D 2200/60* (2013.01)

(58) Field of Classification Search
CPC . A43D 1/025; A43D 3/08; A43D 3/14; B33Y 50/00; G06F 30/10
See application file for complete search history.

(56) References Cited

U.S. PATENT DOCUMENTS 1,746,466  A        2/1930   Galterio
9,460,557  B1 *   10/2016   Tran ..................... G06T 15/205
(Continued)

FOREIGN PATENT DOCUMENTS

CN      205848858 U     1/2017
DE        3805721 A1    12/1988
(Continued)

*Primary Examiner* — Bijan Mapar
(74) *Attorney, Agent, or Firm* — The Webb Law Firm

(57) ABSTRACT

Disclosed is a method for manufacturing a device for adapting a footwear to the specific deformations of the foot of a user, including creating 3D scans of the foot in weight bearing and non-weight bearing positions, as well as of the footwear; determining rubbing areas between the foot and the footwear by means of superimposing the scanned 3D image of the footwear and the scanned 3D images of the weight bearing and the non-weight bearing foot; obtaining a final out-of-phase 3D image of the non-weight bearing foot, wherein the rubbing areas in this image are moved out of phase until they reach an intermediate position selected between a minimum and a maximum limit; printing the part of the heel and the part of the forefoot from the final out-of-phase 3D image. Finally, fitting a flexible element for joining together the part of the heel and the part of the forefoot.

4 Claims, 4 Drawing Sheets

(51) Int. Cl.
*B33Y 50/00* (2015.01)
*A43D 3/08* (2006.01)
*A43D 3/14* (2006.01)

(56) References Cited

U.S. PATENT DOCUMENTS

2004/0074112 A1   4/2004  Gislason
2017/0228859 A1*  8/2017  Schouwenburg .... A43B 7/1435
2019/0139252 A1*  5/2019  Zaiss ................ G06K 19/06028

FOREIGN PATENT DOCUMENTS

GB       189620800 A    7/1897
GB          229921 A    3/1925

* cited by examiner

METHOD FOR MANUFACTURING A DEVICE FOR ADAPTING A FOOTWEAR TO THE SPECIFIC DEFORMATIONS OF THE FOOT OF A USER AND DEVICE

CROSS-REFERENCE TO RELATED APPLICATIONS

This application is the United States national phase of International Application No. PCT/EP2018/062217 filed May 11, 2018, and claims priority to European Patent Application No. 17382342.8 filed Jun. 7, 2017, the disclosures of which are hereby incorporated by reference in their entirety.

BACKGROUND OF THE INVENTION

Field of the Invention

The present disclosure relates to a method for manufacturing a device (a last) for footwear and to the manufactured device, so that the device is capable of adapting all kinds of footwear, before they are used, to the potential specific deformations of a foot.

It is of particular use in the industry that manufactures sports shoes, that is, boots, primarily for football and rugby players, preventing chafing, discomfort and even injuries to the user, although it can also be applied to any kind of street shoes, and aimed at any user that may have a foot deformity, such as bunions.

Description of Related Art

As is common knowledge, when a new shoe is worn for the first time it is common for the feet to rub against the shoe, which results in discomfort and can even cause wounds, which are painful, and that even when a different footwear item that has already been used and adapted to the foot is used, they still cause pain and discomfort, all of which is worsened when a user has feet deformations.

Therefore, the only existing option is based on using conventional devices (lasts) in order to stretch and enlarge the shoe, which essentially comprise a rod joined to a first part that is more or less pointed and with a uniform in its geometry, and a potential second part, so that the first part is inserted all the way to the toe of the footwear and the potential second part rests against the inner surface of the heel in order to exert a certain degree of pressure on it. These devices are used for enlarging and maintaining the shape of the footwear, preventing wrinkles that result from using the item, instead of adapting the footwear to the specific structure of the foot of the user.

SUMMARY OF THE INVENTION

By contrast, unlike the conventional devices that enlarge the footwear homogeneously, the present invention deforms a specific part of said footwear, the part of the forefoot and/or the part of the heel, so it takes advantage of the capacity of the material of the footwear to be deformed in order to match the potential deformations of the foot of a user, such as bunions, claw toes, etc. When the device obtained is inserted in the footwear item before it has been used, it is capable of adapting said item to the deformations of the foot, so that when the item is worn it does not rub against the foot.

In addition, the fact that it incorporates the geometry of the heel is very important for preventing and treating certain ailments such as the swelling of Achilles tendons, Haglund's deformity, etc.

The present invention refers to a method for manufacturing a device for adapting a footwear to the specific deformations of the foot of a user. The method may comprise the following steps: creating a first 3D scan of the weight bearing foot, a second 3D scan of the non-weight bearing foot, and a third 3D scan of the footwear, and sending the images obtained to a computer; determining the rubbing areas between the foot of the user and the footwear by means of superimposing the scanned 3D image of the footwear and the scanned 3D images of the weight bearing and the non-weight bearing foot, wherein said rubbing areas are the areas of the 3D images of the weight bearing and the non-weight bearing foot that protrude from the volume of the scanned 3D image of the footwear; obtaining a final out-of-phase 3D image of the non-weight bearing foot, wherein the rubbing areas of the 3D image of the non-weight bearing foot are moved out of phase until they reach an intermediate position selected between a minimum limit set by the 3D image of the weight bearing foot and a maximum limit set by a final out-of-phase 3D image of the footwear; obtaining the part of the heel and the part of the forefoot separately by means of a 3D printer connected to the computer, from the final out-of-phase 3D image of the non-weight bearing foot. Finally, a flexible element for joining together the part of the heel and the part of the forefoot is fitted, obtaining in this way the device to be placed in the footwear to be used.

Another object of the invention refers to the device for adapting a footwear to the specific deformations of the foot of a user obtained following the manufacturing method described above, wherein the device comprises a part of the heel and a part of the forefoot joined together by means of a flexible element.

The part of the heel and the part of the forefoot may have a reticulated or a solid structure.

BRIEF DESCRIPTION OF THE DRAWINGS

To complete the description and in order to give a better understanding of the features of the invention, this specification is accompanied by a series of drawings that are an integral part of the same, wherein the following has been represented for illustration purposes and without limitation.

Figure 1:
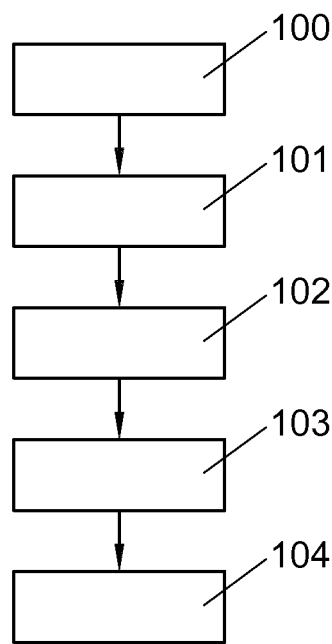
FIG. 1 shows a flow diagram of the steps comprising the method.
Figure 2:
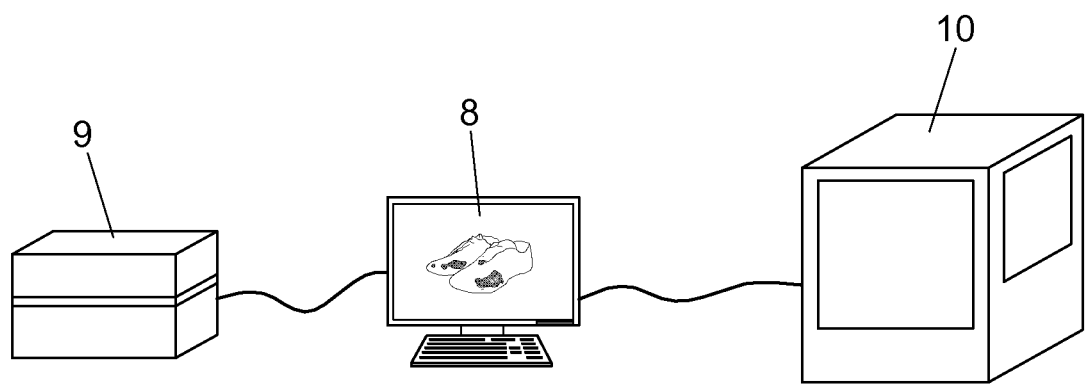
FIG. 2 shows the connection between the computer, the 3D printer and the scanner used in the method.
Figure 3:
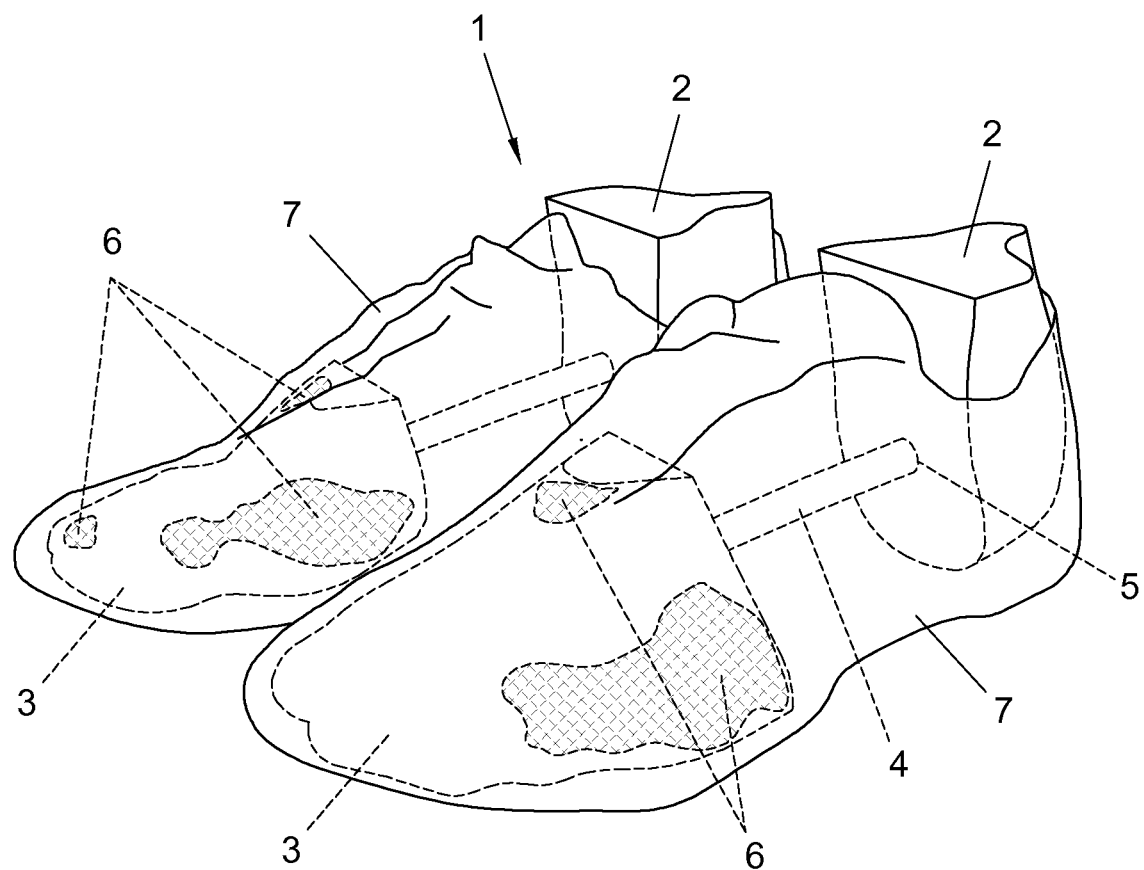
FIG. 3 shows a perspective view of some devices for adapting the footwear to the specific deformations of the foot of the user after they have already been inserted in the footwear to be adapted. It displays the areas of the footwear being adapted to the deformations of the foot of the user in order to prevent them from rubbing against the foot.
Figure 4:
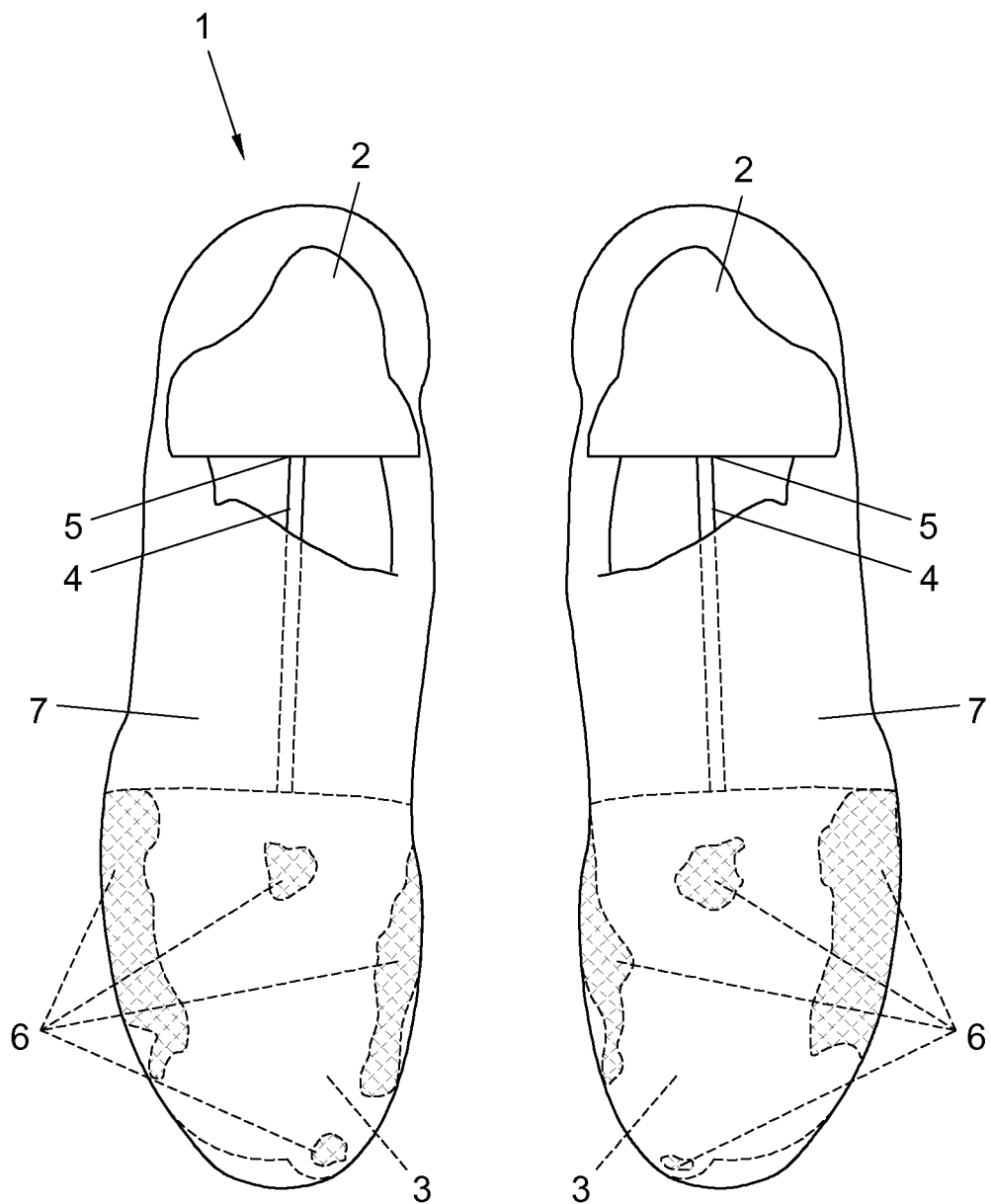
FIG. 4 shows a plan view of FIG. 3.

A list of the different elements that have been represented in the figures and which form part of the invention is detailed below:

1. Device for adapting a footwear to the specific deformations of the foot.

2. Part of the heel.
3. Part of the forefoot.
4. Flexible element.
5. Hole.
6. Rubbing areas.
7. Footwear.
8. Computer.
9. Scanner.
10. 3D printer.
100. First step: Scanning and sending images to the computer.
101. Second step: Determining the rubbing areas between the foot of the user and footwear.
102. Third step: Obtaining the final out-of-phase 3D image of the non-weight bearing foot.
103. Fourth step: Obtaining the part of the heel and the part of the forefoot of the device.
104. Fifth phase: Manufacturing the device for adapting a footwear to the specific deformations of the foot.

DETAILED DESCRIPTION OF THE DRAWINGS

The method for manufacturing a device (1) for a footwear (7) that is the object of the invention allows the manufacturing of devices (1) (lasts) that adapt a footwear (7) to the specific deformations of the foot.

In some non-limiting embodiments or aspects, when a football or rugby player, or a player of a similar sport, has some kind of deformity of the foot, a new pair of boots may rub against their feet and cause them discomfort. In order to avoid this, once the devices (1) have been manufactured, they are placed in the new boots of the player for several days, so that when the player uses them for the first time, the boots will be totally adapted to the geometry and the deformities of his foot, so that his foot will no longer be in pain.

The method comprises a first step of scanning and sending images to the computer (100), in which the scanner (9) makes a first 3D scan of the weight-bearing foot of the user (when the foot is placed on the floor supporting the weight of the user), a second 3D scan of the non-weight bearing foot of the user (when the foot is not supporting the weight of the use), and a third 3D scan of the footwear (7) to be worn by the user. This provides the information detailing how weight bearing affects the deformation of the non-weight bearing foot. The images obtained are sent to a computer (8).

The scanner (9) may be replaced by an equivalent means, such as a depth detector.

Then, the second step determines the rubbing areas between the foot and the footwear (101), wherein the 3D image of the footwear is superimposed over the weight bearing 3D image and the non-weight bearing 3D image of the foot in order to determine which areas of the foot rub against the footwear (7). These areas, which are visible to the naked eye, are the ones that protrude from the volume of the scanned 3D image of the footwear.

Afterwards, the third step obtains the final out-of-phase 3D image of the non-weight bearing foot (102), which will be used to manufacture the part of the heel (2) and the part of the forefoot (3) of the device (1). In order to do so, the non-weight bearing scanned 3D image of the foot of the user is utilised as a starting point, this image is placed out of phase, slightly increasing the size thereof, for example, by means of known modification tools or computer programs for designing images, with the rubbing areas (6) of said non-weight bearing scanned 3D image of the foot varying until they reach an intermediate position selected between a minimum limit set by the rubbing areas (6) of the 3D image of the weight bearing foot and a maximum limit set by a final out-of-phase 3D image of the footwear (7); wherein said final out-of-phase 3D image of the footwear (7) corresponds with the scanned 3D image of the footwear (7) that is out of phase in the rubbing areas (6).

The technician determines the out of phase the rubbing areas (6) of the scanned 3D image of the footwear (7) based on their experience and expertise (their knowledge about the type of foot deformation, the material of the footwear item, etc.). That is, the general knowledge of a skilled person in the field.

In the fourth step, the part of the heel and the part of the forefoot of the device (103) are obtained. In order to do so, they are generated from the final out-of-phase 3D image of the non-weight bearing foot, and the part of the heel (2) and the part of the forefoot (3) of the device (1) are created separately by means of a 3D printer (10).

The 3D printer (10) is connected to the computer (8) and printing is carried out by means of the software of the 3D printer (10), ISO type. Finally, in the fifth step of manufacturing the device for adapting a footwear to the specific deformations of the foot (104), the device (1) is finally manufactured by fitting a flexible element (4) for joining the part of the heel (2) and the part of the forefoot (3) obtained in the previous phase, thus defining the device (1) to be placed in the footwear (7) to be used, with the aim of deforming said parts of the footwear (7) that, if it were to be used, would rub against the foot of the user.

The flexible element (4) facilitates inserting the device (1) in the footwear (7) while also exerting certain pressure on the part of the forefoot (3) and the part of the heel (2). Said flexible element (4) can be replaced by an equivalent means, such as a tensioner means that can regulate the distance between the part of the forefoot (3) and the part of the heel (2), as well as how it can be adapted to different sizes of footwear.

Therefore, another object of the invention is the device (1) itself obtained by the method explained above, wherein both the part of the heel (2) and the part of the forefoot (3) comprise a blind hole (5), several centimetres wide, created when they are manufactured by the 3D printer (10), in which the flexible element (4) for joining both parts (2, 3) is inserted and secured.

As explained above, this device (1) allows to adapt the footwear to the deformities of the foot in order to avoid rubbing between the foot and the footwear (7). More specifically, the part of the forefoot (3) and/or the part of the heel (2) of the device (1) are enlarged or deformed only in the areas needed so that they do not rub against the foot, as opposed to conventional devices that enlarge the entire footwear homogeneously.

Figure 5:
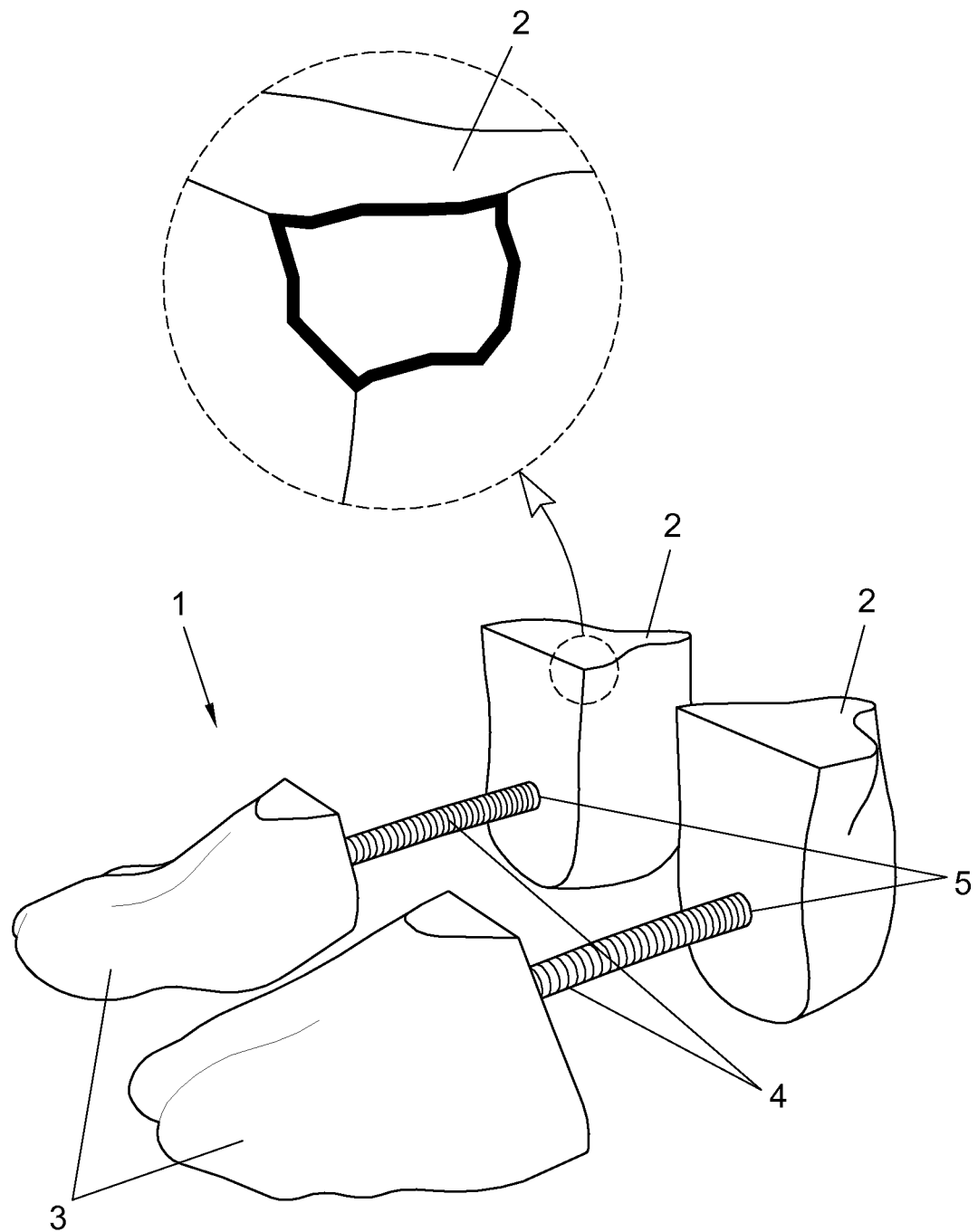
FIG. 5 shows a perspective view of a design of some devices, wherein the part of the forefoot and the part of the heel joined by the flexible element are displayed. A detail shows that the device is not solid.

In some non-limiting embodiments or aspects, the part of the heel (2) and the part of the forefoot (3) have a reticulated structure with the aim of reducing the weight and the material used, though naturally, they may have a solid structure. FIG. 5 shows a detail highlighting that the part of the heel (2) and the part of the forefoot (3) are not solid.

The present invention is not limited by the embodiment disclosed herein. Other embodiments can be made by persons skilled in the art in light of this description.

The invention claimed is:
1. A method for manufacturing a device for adapting footwear to specific deformations of a foot of a user, the method comprising:
creating a first 3D scan of a weight bearing foot, a second 3D scan of a non-weight bearing foot, and a third 3D scan of footwear, and sending the first 3D scan, the second 3D scan, and the third 3D scan to a computer;

determining rubbing areas between the weight bearing foot of the user and the footwear by:

superimposing the third 3D scan with the first 3D scan and the second 3D scan, wherein said rubbing areas are areas in the first 3D scan and the second 3D scan that protrude from a volume of the third 3D scan;

obtaining a final out-of-phase 3D image of the non-weight bearing foot, wherein the rubbing areas in the second 3D scan of the non-weight bearing foot are moved out of phase until they reach an intermediate position selected between a minimum limit set by the first 3D scan of the weight bearing foot and a maximum limit set by a final out-of-phase 3D image of the footwear;

separately obtaining, from the final out-of-phase 3D image of the non-weight bearing foot, a part of a heel and a part of a forefoot of the foot of the user by means of a 3D printer connected to the computer, and;

obtaining a device to be placed in the footwear by fitting a flexible element for joining together the part of the heel and the part of the forefoot.

2. A device for adapting footwear to specific deformations of a non-weight bearing foot, comprising part of the heel and the part of the forefoot joined together by a flexible element, wherein the device is obtained by the manufacturing method of claim 1.

3. The device according to claim 2, wherein the part of the heel and the part of the forefoot have a reticulated structure.

4. The device according to claim 2, wherein the part of the heel and the part of the forefoot have a solid structure.

* * * * *